US010183859B2

(12) United States Patent
Kosberg et al.

(10) Patent No.: US 10,183,859 B2
(45) Date of Patent: Jan. 22, 2019

(54) DUAL RANGE HIGH PRECISION PRESSURE SENSOR

(71) Applicant: Continental Automotive Systems, Inc., Auburn Hills, MI (US)

(72) Inventors: Robert Charles Kosberg, Wildwood, IL (US); James Lee Nowicki, Jr., Libertyville, IL (US)

(73) Assignee: Continental Automotive System, Inc., Auburn Hills, MI (US)

( * ) Notice: Subject to any disclaimer, the term of this patent is extended or adjusted under 35 U.S.C. 154(b) by 489 days.

(21) Appl. No.: 14/508,538

(22) Filed: Oct. 7, 2014

(65) Prior Publication Data

US 2015/0107367 A1   Apr. 23, 2015

Related U.S. Application Data

(60) Provisional application No. 61/893,356, filed on Oct. 21, 2013.

(51) Int. Cl.
*B81B 7/00* (2006.01)
*G01L 9/00* (2006.01)
(Continued)

(52) U.S. Cl.
CPC .......... *B81B 7/008* (2013.01); *G01L 9/0055* (2013.01); *G01L 9/06* (2013.01); *G01L 9/065* (2013.01);
(Continued)

(58) Field of Classification Search
CPC .......... B81B 2201/0264; B81B 7/008; G01L 19/0084; G01L 19/142; G01L 9/0055;
(Continued)

(56) References Cited

U.S. PATENT DOCUMENTS 4,250,553 A * 2/1981 Sebens ................. F23N 1/00
356/315
4,419,620 A   12/1983 Kurtz et al.
(Continued)

FOREIGN PATENT DOCUMENTS

CN   101711348 A   5/2010
CN   102132136 A   7/2011

OTHER PUBLICATIONS

Search Report dated Sep. 3, 2014, from corresponding GB Patent Application No. GB1323009.9.

*Primary Examiner* — Randy Gibson
*Assistant Examiner* — Gedeon M Kidanu

(57) ABSTRACT

A high-precision pressure sensor with two or more pressure ranges is formed from multiple micro-electromechanical system (MEMS) pressure transducers mounted inside a housing and coupled to sense a pressurized fluid. The non-linear outputs of the MEMS pressure transducers are linearized by a corresponding number of processors, preferably DSPs, each processor being coupled to a corresponding MEMS pressure transducer and receiving the MEMS pressure transducer output signal there from. Each processor generates an applied pressure output signal, which is representative of a pressure applied to the MEMS pressure transducer, which is a linearized and digitized version of output signal from the MEMS pressure transducers. The data that is output from multiple processors, each of which outputs pressure data pertaining to a different range of pressures, is transmitted serially on a serial data bus.

13 Claims, 8 Drawing Sheets

(51) Int. Cl.
*G01L 9/06* (2006.01)
*G01L 19/00* (2006.01)
*G01L 19/14* (2006.01)

(52) U.S. Cl.
CPC ........ *G01L 19/0084* (2013.01); *G01L 19/142* (2013.01); *B81B 2201/0264* (2013.01)

(58) Field of Classification Search
CPC . G01L 9/06; G01L 9/065; G01L 15/00; G01L 1/2275; G01L 9/00; G01L 9/0054; G01N 9/26; G01N 9/266; G01R 15/005
USPC ............ 73/721, 727, 754, 862.622; 702/117
See application file for complete search history.

(56) References Cited

U.S. PATENT DOCUMENTS

| | | | | |
|---|---|---|---|---|
| 4,872,349 | A * | 10/1989 | Espiritu-Santo | G01L 19/148 73/727 |
| 6,449,571 | B1 * | 9/2002 | Tarig | G01F 1/6965 137/486 |
| 7,532,992 | B2 * | 5/2009 | Liescheski | G01D 3/022 702/100 |
| 8,026,906 | B2 * | 9/2011 | Molne | G06F 3/0418 345/174 |
| 8,175,835 | B2 * | 5/2012 | Dmytriw | G01F 25/0007 702/100 |
| 8,437,976 | B2 * | 5/2013 | Kurtz | G01N 9/266 702/117 |
| 8,466,523 | B2 * | 6/2013 | Chiou | G01L 9/0052 257/417 |
| 8,520,839 | B2 * | 8/2013 | Gammel | H04L 9/0631 380/28 |
| 8,577,634 | B2 * | 11/2013 | Donovan | G05B 19/0423 702/79 |
| 2010/0074157 | A1 * | 3/2010 | Doh | H04W 84/18 370/311 |
| 2010/0257936 | A1 * | 10/2010 | Kurtz | G01L 9/0054 73/721 |
| 2011/0010522 | A1 * | 1/2011 | Abts | G06F 15/17375 712/3 |
| 2012/0158335 | A1 | 6/2012 | Donovan et al. | |
| 2013/0218502 | A1 * | 8/2013 | Artiuch | G01L 9/045 702/98 |

* cited by examiner $$V_{out} = VS\ [\underbrace{a_0 + a_1 v_T + a_2 v_T^2 + a_3 v_T^3}_{\text{Offset}} + \underbrace{(b_0 + b_1 v_T + b_2 v_T^2 + b_3 v_T^3) V_P}_{\text{Span}} + \underbrace{(c_0 + c_1 v_T + c_2 v_T^2) V_P^2}_{\text{Non-Linearity}}\ ]$$

DUAL RANGE HIGH PRECISION PRESSURE SENSOR

BACKGROUND

Many sensors use so-called MEMS (Micro-electromechanical Systems) technology to achieve high performance electronic devices at a relatively low cost. One such sensor is a fluid pressure sensor that uses a MEMS pressure transducer, an example of which is disclosed in U.S. Pat. No. 8,466,523 entitled, Differential Pressure Sensor Device, the entire content of which is incorporated herein by reference.

Put simply, a MEMS pressure transducer comprises a small, thin silicon diaphragm onto which a piezoresistive circuit is formed, normally a Wheatstone bridge, well known to those of ordinary skill in the electronic arts. Diaphragm deflections caused by pressure applied to the diaphragm change the resistance values of the piezoresistors in the bridge circuit. An electronic circuit coupled to the bridge circuit detects the resistance changes of the piezoresistive bridge circuit and outputs an electrical signal, which changes with diaphragm deflections and is thus representative of the pressure applied to the diaphragm. The output signal is typically a D.C. voltage, the magnitude of which changes with applied pressure and thus corresponds to an applied pressure.

While MEMS pressure transducers have proven to be rugged, accurate, and relatively low cost, the signals output from a MEMS pressure transducer are usually non-linear. They can also vary widely and unpredictably between different MEMS pressure transducer devices. It is therefore often necessary to "process" a signal output from a MEMS pressure transducer in order to provide an electrical signal that varies linearly over a predetermined range of pressures applied to a MEMS pressure transducer.

Fluid pressure sensors that use MEMS pressure transducers typically perform various predetermined mathematical operations on the electrical signal output from a MEMS pressure transducer in order to provide a signal that varies linearly or at least substantially linearly across a predetermined range of pressures applied to a MEMS pressure transducer. Those mathematical operations are preferably performed by a digital signal processor (DSP), which is programmed with instructions, which, when executed, compensate or adjust the non-linear output signal from a MEMS pressure transducer to provide a signal that varies linearly across a range of pressures.

In some pressure-sensing applications, such as internal combustion engine fuel injection, it might be desirable or even necessary to provide a reasonably accurate measurement of fuel rail pressures that might vary between 1 bar (1 atmosphere) up to as much as 500 bar (500 atmospheres). For economy purposes or emission control purposes, however, it might be necessary to more accurately measure fuel rail pressures over different pressure ranges.

A problem with prior art pressure sensors that compensate the output of a MEMS pressure transducer using a processor is that the processors are unable to autonomously change their programming parameters according to different requirements in order to provide an output signal having greater accuracy over a narrow range of pressures. In other words, prior art pressure sensors that compensate the output of a MEMS pressure transducer using a pre-programmed processor are not able to provide a "dual range" or "multi-range" pressure sensing capability, i.e., a pressure sensor with different "sensitivities." Stated yet another way, it would be an improvement over the prior art if a single pressure sensor housing, which could be attached to a pressurized fluid at a single location, could provide one or more different output signals, the output values which can range between the same lower and upper limits but responsive to different ranges of input pressures.

BRIEF SUMMARY

Embodiments of the invention are directed to a high-precision pressure sensor with two or more pressure ranges is formed from multiple micro-electromechanical system (MEMS) pressure transducers mounted inside a housing and coupled to sense a pressurized fluid. The non-linear outputs of the MEMS pressure transducers are linearized by a corresponding number of processors, preferably DSPs, each processor being coupled to a corresponding MEMS pressure transducer and receiving the MEMS pressure transducer output signal there from. Each processor generates an applied pressure output signal, which is representative of a pressure applied to the MEMS pressure transducer, which is a linearized and digitized version of output signal from the MEMS pressure transducers. The data that is output from multiple processors, each of which outputs pressure data pertaining to a different range of pressures, is transmitted serially on a serial data bus.

DETAILED DESCRIPTION

Figure 1:
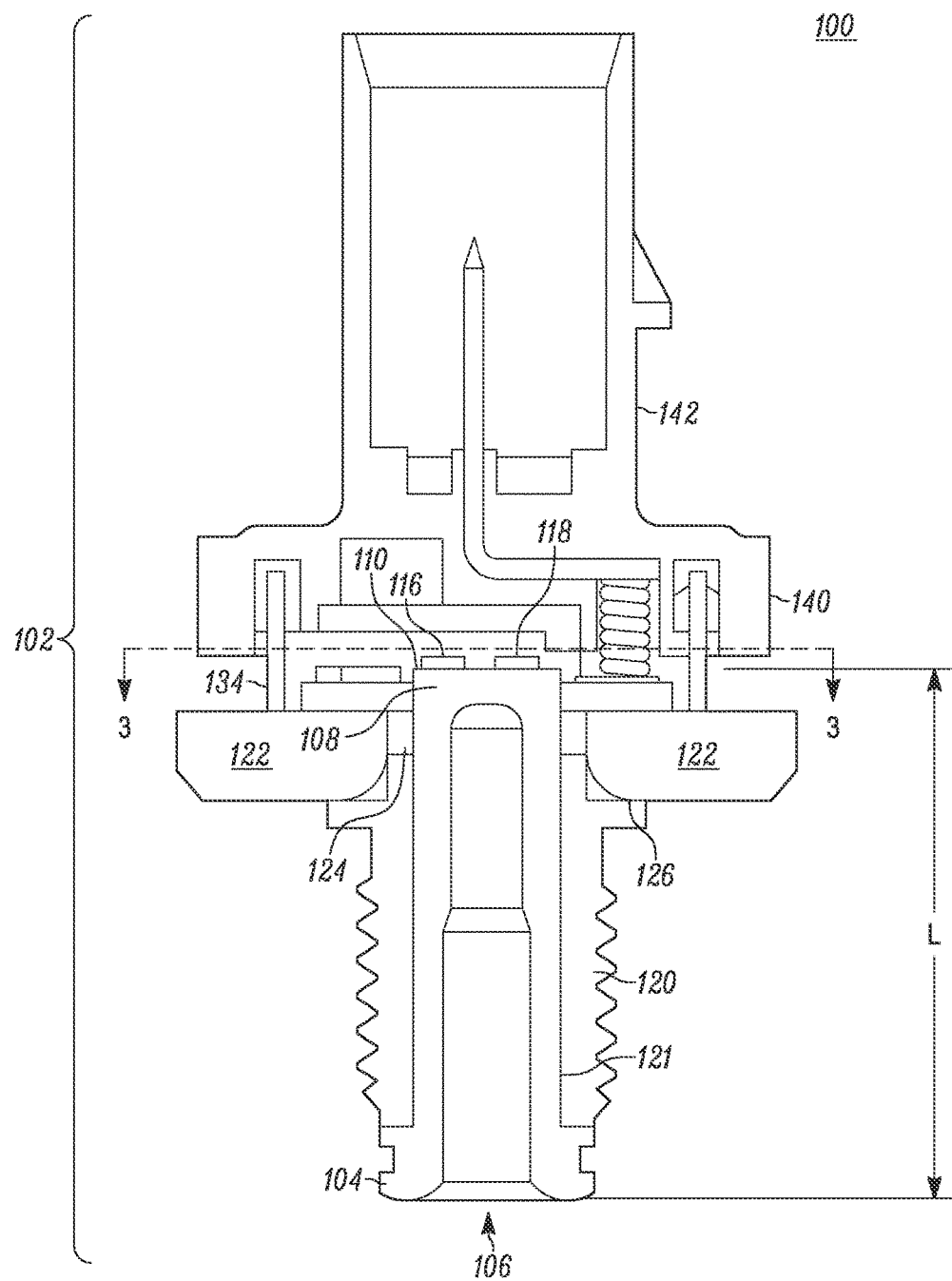
FIG. 1 is a cross-sectional view of a dual-range, high-precision pressure sensor.
Figure 2:
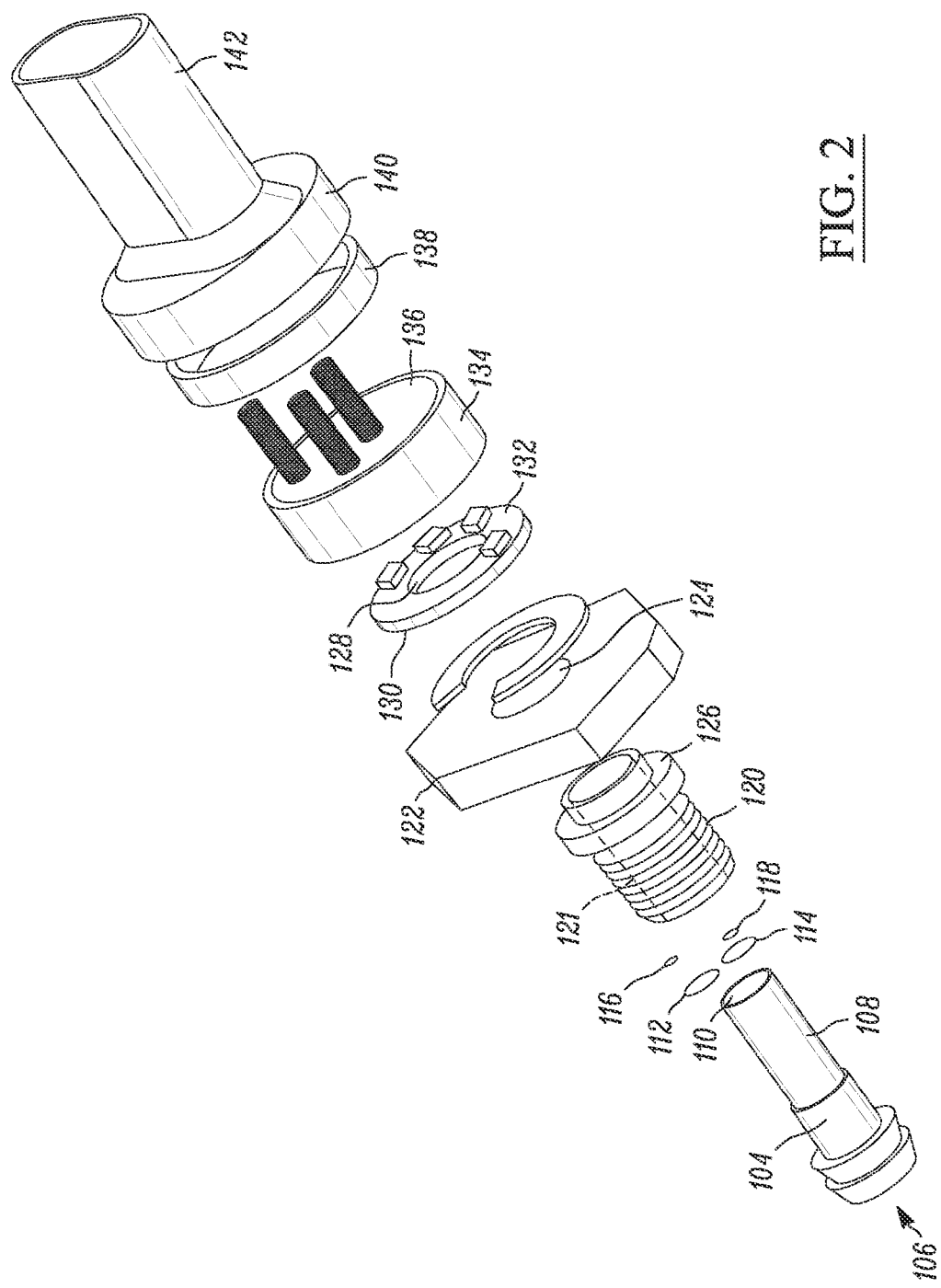
FIG. 2 is an exploded view of the pressure sensor shown in FIG. 1.

FIG. 1 is a cross-sectional view of a dual-range high-precision pressure sensor 100. FIG. 2 is an exploded view of the pressure sensor 100.

The pressure sensor 100 comprises a housing 102, which in turn comprises a fluid pressure port 104, which is also referred to as simply a "fluid port" 104, which is an elongated cylinder that is open at a first end 106 and closed at the opposite second end 108. As best seen in FIG. 1, being a cylinder, the fluid port 104 is hollow, at least from the first end 106 up to the substantially planar second end 108.

The second end 108 has an outer, top surface 110 which is substantially planar and supports glass pedestals 112, 114.

The glass pedestals 112, 114 are typically attached to the top surface 110 by an epoxy. But they also support corresponding micro-electromechanical systems (MEMS) pressure transducers 116, 118. In other words, each pedestal 112, 114 supports a MEMS pressure transducer 116, 118, respectively.

MEMS pressure transducers 116, 118 and their mounting pedestals 112, 114 are well known in the art. A MEMS pressure transducer is described in the aforementioned issued U.S. Pat. No. 8,466,523, the entire content of which is incorporated herein by reference.

The fluid pressure port 104, glass pedestals 112, 114 and the MEMS pressure transducers 116, 118 are sized and shaped to fit within a threaded shell 120 the central interior of which is a hollow cylinder 121. The inside diameter of the hollow cylinder 121 inside the threaded shell 120 is sized to mate with and receive the fluid port 104. Stated another way, the fluid port 104 has an outside diameter such that the fluid port 104 fits snugly inside the hollow cylinder 121 formed inside the threaded shell 120.

As best seen in FIG. 1, the fluid port 104 has a length, L, which extends through the threaded shell 120 and, as best seen in FIG. 2, through a hexagonally-shaped nut 122 having a circular central opening 124. The hexagonally-shaped nut or "hex" nut 122 is applied over and glued or ultrasonically welded to the top end 126 of the threaded shell 120. The fluid port 104 also extends through the circular central opening 124 and into a centrally-located opening 128 in an annulus-shaped printed circuit board 130.

As can be seen in both FIG. 1 and FIG. 2, the printed circuit board 130 supports a plurality of electronic components. Those components include at least one integrated circuit die 132.

As used herein, "die" refers to a small block of a semiconductor material, on which one or more functional circuits are fabricated. The terms digital signal processor and "DSP" both refer to a specialized microprocessor with an architecture optimized for digital signal processing. Semiconductor dies and DSPs are well known to those of ordinary skill in the semiconductor arts.

In the figures, the silicon die 132 is fabricated using known techniques to provide or include at least two identical DSPs but which are separately and independently programmable, which means they can be programmed differently. The DSPs are not visible in FIG. 1 or FIG. 2 due to their small size and their being embedded in and forming part of the silicon die 132. The DSPs are, however, functionally separate and independent from each other.

Still referring to FIG. 1 and FIG. 2, the annulus-shaped printed circuit board 130 fits snugly within a substantially cylindrical steel tube 134, which protects the circuit board 130 and the components it carries from physical damage. The top edge 136 of the tube 134 is embedded into a toroid-shaped layer of an epoxy sealant 138, which provides an air-tight seal. The sealant 138 and tube 134 fit within a lower, cylindrical portion 140 of a molded plastic connector cap 142.

When the fluid port 104, threaded shell 120, hex nut 122, cylinder 134, and connector cap 142 are assembled together as shown in FIG. 1, they comprise a substantially air-tight housing 102 in which MEMS pressure transducers 116, 118 are located along with the silicon die 130 and the circuitry embedded in the die, i.e., processors. An enclosed volume exists above the circuit board 130, below the connector cap 142, and within the cylinder 134.

Figure 3:
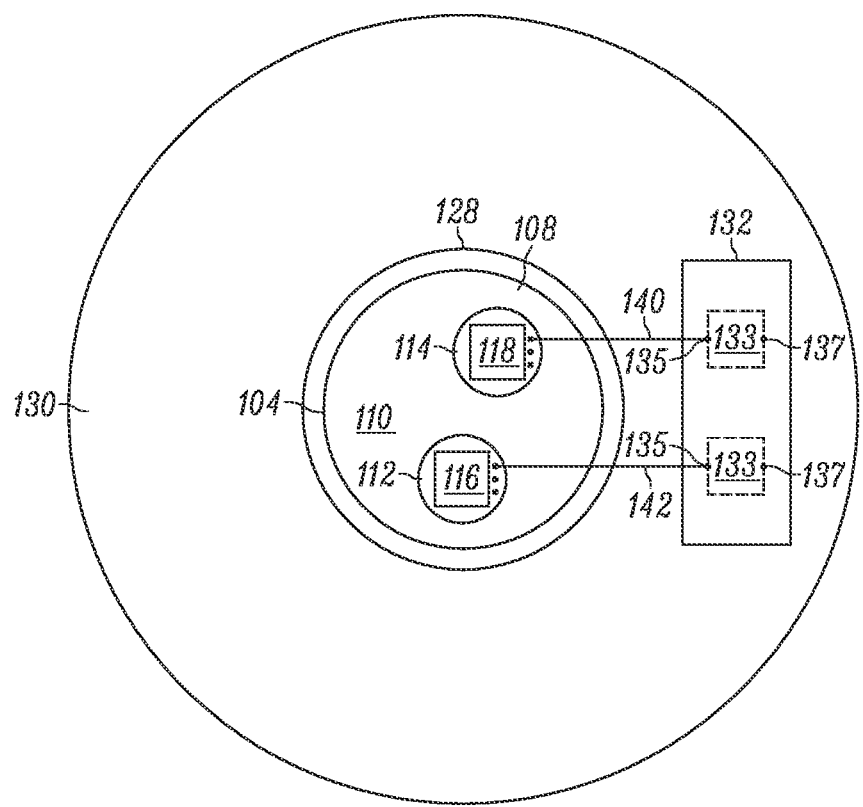
FIG. 3 is a top view of the pressure sensor shown in FIG. 1 through section lines 3-3.

FIG. 3 is a cross-sectional view of the pressure sensor 100 shown in FIG. 1, taken through section lines 3-3. FIG. 3 thus shows the top surface of the printed circuit board 130 to which the MEMS pressure transducers 116, 118 and silicon die 132 are attached.

As described above, the printed circuit board 130 is essentially an annulus or flattened ring. It is flat, circular, and has a centrally-located hole or opening 128. The centrally-located opening 128 in the circuit board 130 has an inside diameter sized to allow the fluid port 104 to pass through. The two MEMS pressure transducers 116, 118 are attached to glass pedestals 112, 114, which are themselves attached to the top surface 110 of the second end 108 of the fluid port 104. The MEMS pressure transducers 116, 118 and the pedestals 112, 114 on which they are mounted are thus considered to be located within the opening 128 of the circuit board 130 and within the open space that exists above the circuit board 130, below the connector cap 142 and within the cylinder 134.

In FIG. 3, a single silicon semiconductor die 132 is located to the right side of the MEMS pressure transducers 116, 118. As stated above, the silicon die 132 is fabricated to have at least two DSPs 133. An input terminal 135 of each DSP 133 is connected to a corresponding MEMS pressure transducer 116, 118 by thin wires 140, 142 that extend between the DSPs and the MEMS pressure transducers 116, 118. The wires 140, 142 carry output voltage signals from the MEMS pressure transducers 116, 118 to corresponding input terminals of corresponding DSPs embedded in the die 132. The DSPs 133 have an output terminal 137 from which a serial bit stream is output, the format of which complies with the well-known "SENT" protocol.

The voltages, or currents, output from the MEMS pressure transducers 116, 118 are of course electrical signals, at least one characteristic of which is a magnitude. In a preferred embodiment, the magnitude of the voltage output from a MEMS pressure transducer represents and corresponds to deflection of a diaphragm of a MEMS pressure transducer. As stated above, however, the output from a MEMS pressure transducer is usually non-linear: increasing a pressure applied to a MEMS pressure transducer does not necessarily cause an equivalent or even a proportional change in the magnitude of the signal output from the MEMS pressure transducer. By way of example, doubling the pressure applied to a MEMS pressure transducer will not necessarily cause the signal output from the MEMS pressure transducer to double. But it may instead change by some unknown amount or factor. The magnitude of the signal output from a MEMS pressure transducer can nevertheless be represented by a number, i.e., its magnitude. The signals output from the MEMS pressure transducers can thus be "operated on" or "processed" by the DSPs in the silicon die 132 to compensate or adjust the values of the signals representing MEMS pressure transducer outputs in order to make the MEMS pressure transducers appear to provide a linearly-varying output signal. The DSPs thus "linearize" the non-linear outputs of a MEMS pressure transducer. But the DSPs also "scale" the output from the MEMS pressure transducer such that they range between a lower, minimum value and a maximum value responsive to different applied pressures.

Figure 4A:
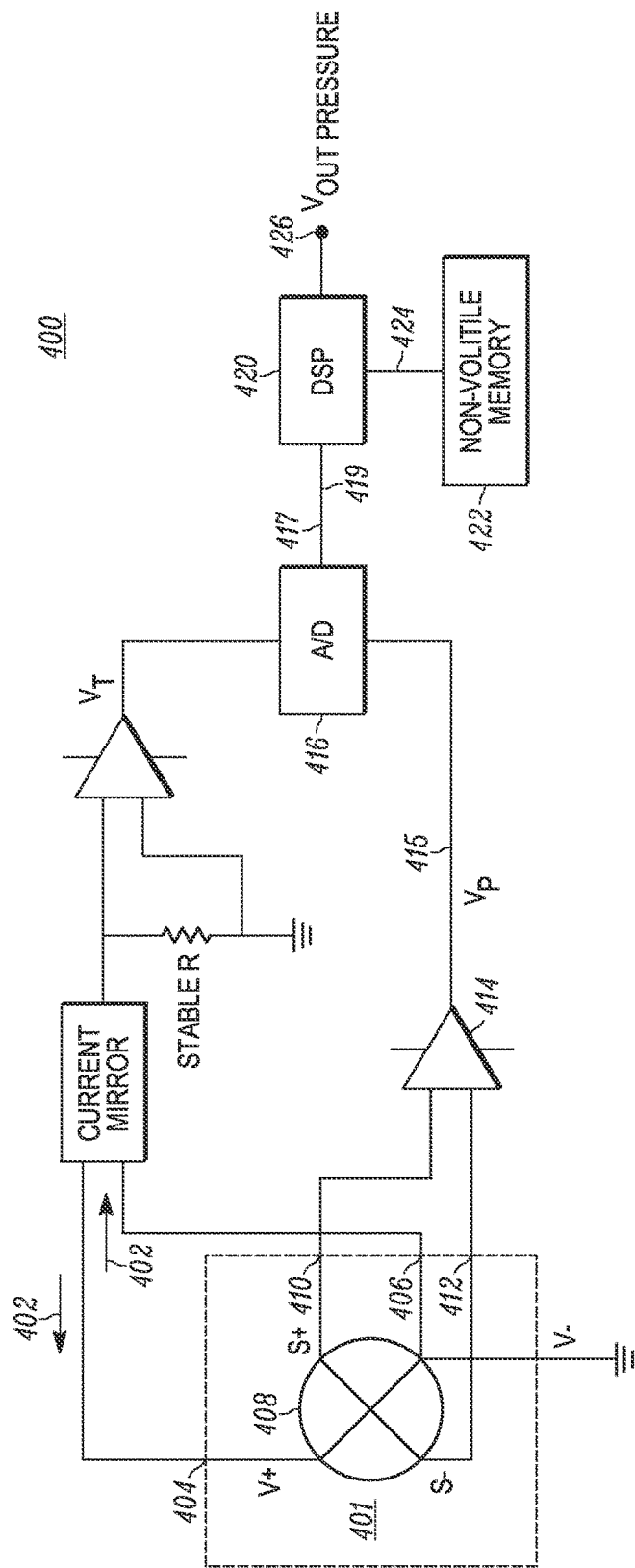
FIG. 4A is a block diagram representation of the electronics of a high-precision pressure sensor that employs a MEMS pressure transducer.

FIG. 4A is a block diagram of the electronics of a pressure sensor 400 that employs a MEMS pressure transducer 401. Two or more such sensors 400 placed inside a single housing, such as the housing 102 shown in FIGS. 1 and 2, provide a high-precision, dual-range or multi-range pressure sensor. It can also be threaded into a mated threaded connection by which both sensors are fluidly coupled to the same pressurized fluid.

In FIG. 4A, a D.C. current 402 is provided to the two input terminals 404, 406 of a Wheatstone bridge circuit 408, which is formed into the thin silicon diaphragm of the MEMS pressure transducer 401, including the MEMS pressure transducers 16, 118 shown in FIGS. 1 and 2 as well as the MEMS pressure transducer depicted in U.S. Pat. No. 8,466,523.

The Wheatstone bridge 408 is represented schematically by a circle 409 circumscribed around two crossed lines 411. The two output terminals 410, 412 of the Wheatstone bridge 408 of the MEMS pressure transducer 401 are connected to a differential amplifier 414, configured to amplify and thus "scale" the output voltage of the Wheatstone bridge 408.

Signals 415 from differential amplifier 414 are provided to an analog-to-digital (A/D) converter 416, which in an embodiment is configured to provide a twelve-bit binary output "word," 417, serially, the magnitude and polarity of which corresponds to (and may equal) the magnitude and polarity of the voltage signal 415 output from the differential amplifier 414. The signal output from the Wheatstone bridge 401 and thus the pressure applied to the MEMS pressure transducer in which the bridge 401 is formed is thus represented by the magnitude and polarity of a twelve bit word. As stated above, however, the output of a MEMS pressure transducer is almost always non-linear. Obtaining a linear signal from a non-linear signal requires mathematically processing the non-linear signal to adjust or compensate for conditions and characteristics that cause the non-linearity.

The binary-valued output of the A/D converter 416 is provided to an input port 419 of a DSP 420, however, a "conventional" microprocessor or microcontroller could also be used as could appropriately configured sequential logic circuits and gates. The term "processor" should therefore be construed to include a DSP, microprocessor, microcontroller as well as sequential logic devices, circuits, and logic gates.

The DSP 420 "operates on" digital values provided to the DSP 420 by the A/D converter 416 according to executable program instructions for the DSP 420 that are stored in a non-volatile, i.e., non-transitory memory device 422. The memory device 422 is coupled to the DSP 420 via a conventional bus 424. The memory device 422 and the bus 424 can also be co-resident on the same silicon die as the DSP 420. The DSP 420 has an output terminal 426 at which the aforementioned serial bit stream, compliant with the SENT protocol, is available. The output terminal 426 of the DSP 420 is thus considered to be the output of a high-precision pressure sensor.

As used herein, the term "bus" refers to a set of electrically-parallel conductors, in a computer system, that form a main transmission path between computer system devices.

The executable instructions stored in the memory device 422 cause the DSP 420 to read various environmental conditions from sensors (not shown), which affect the MEMS pressure transducers' operational characteristics. Some of those conditions include ambient temperature, a vehicle's battery or alternator output voltage and an atmospheric pressure. Other instructions enable the DSP to read values that are stored in the memory and which represent physical characteristics of the MEMS pressure transducer itself, examples of which include a diaphragm's area, rigidity, thickness, and characteristics of piezoresistors embedded in the diaphragm. Using such information, the DSP 420 can thereby process a non-linear output signal from the MEMS pressure transducer 401, as represented by the binary value from the A/D, into digital values that vary linearly, i.e., proportionately, with changes in the pressure applied to the MEMS pressure transducer. The output 426 of the pressure sensor 400 is thus a binary number, the magnitude and polarity of which is representative of a pressure applied to a MEMS pressure transducer 401.

As used herein, the term polynomial refers to a mathematical expression made up of one or more algebraic terms, each of which consists of a numeric constant that is multiplied by one or more variables, each of which is raised to a nonnegative integral power. An integer is considered to be any of the natural numbers, the negatives of those numbers and zero. By way of example, the expression, $a+bx+cx^2$ is a polynomial.

Figures 4B, 5:
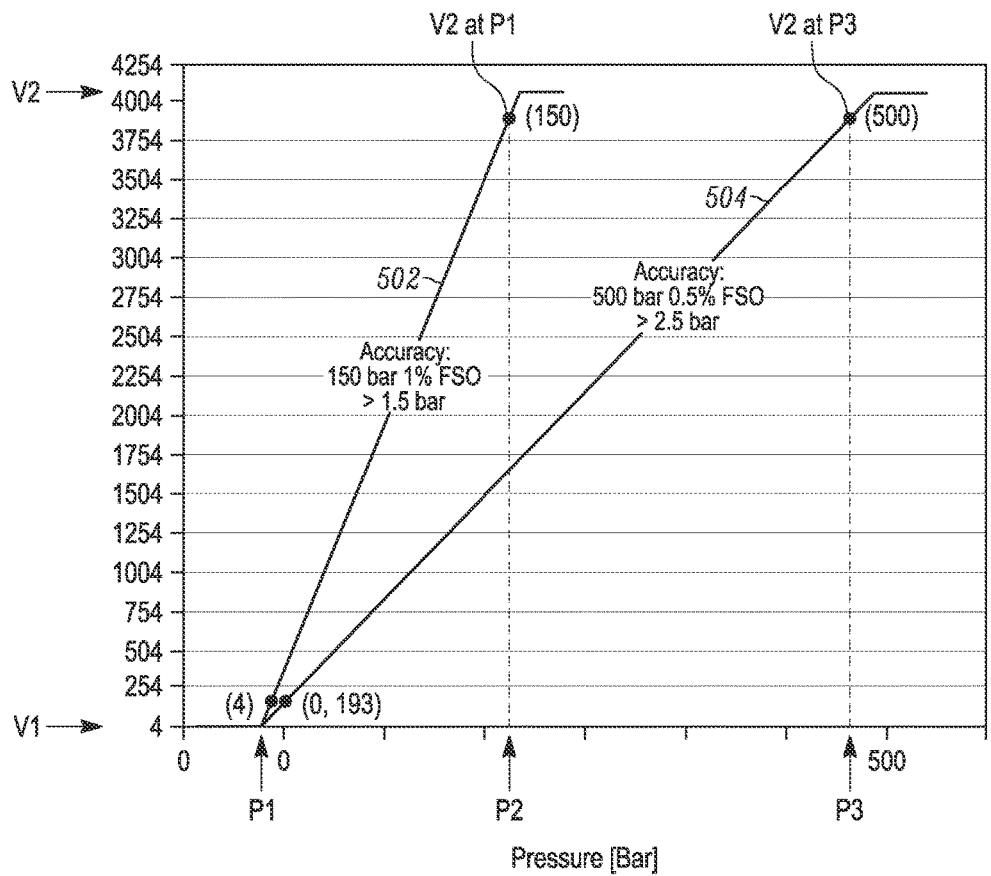
FIG. 4B depicts the form of a polynomial function calculated by a processor in order to provide a linearization of a MEMS pressure transducer output voltage, as shown in FIG. 5.
FIG. 5 is a plot of the output voltages from two MEMS pressure transducer processors.

In an embodiment, linearizing compensation of a MEMS pressure transducer output signal is accomplished by multiplying a numeric value that represents the signal obtained from a MEMS pressure transducer by a "linearizing polynomial." The form of an embodiment of a linearizing polynomial is shown in FIG. 4B, the terms of which, are determined empirically and heuristically and compensate, i.e., adjust, the actual output signal from the MEMS pressure transducer for the various environmental conditions and physical factors and characteristics that cause the MEMS pressure transducer output to be non-linear. In an embodiment, each DSP or other type of processor thus receives a non-linearly varying signal, which is representative of the output of a MEMS pressure transducer, and converts that non-linearly varying signal into a linearly-varying signal represented by digital values by multiplying the non-linearly varying signal by the value of a linearizing polynomial, an example form of which is shown in FIG. 4B.

FIG. 5 is a graph of the voltage output signals 502, 504 provided by two different pressure sensors described above, which are resident in the same housing, such as the housing shown in FIGS. 1 and 2, which are therefore subjected to the same range of input pressures, but which have corresponding DSPs programmed with different linearizing polynomial coefficients such that the output voltages of each sensor varies linearly across the same range of output values but the same range of the output values are generated responsive to completely different ranges of input pressures. Stated another way, FIG. 5 is a graph of the output voltages from a dual-range high-precision pressure sensor that employs two or more MEMS pressure transducers, the outputs of which are processed differently to provide different scalings.

In FIG. 5, a first graph 502 represents a first output signal from a first processor; a second graph 504 represents a second output signal from a second processor.

Both graphs 502, 504 vary linearly between a y-axis value that is a minimum value denominated as, V1 and a maximum value denominated as V2. The minimum value, V1, is a twelve-bit binary number, which either corresponds to, or the value of which actually is a minimum or a zero-valued pressure applied to a MEMS pressure transducer. The maximum value, V2, is a twelve-bit binary number which either corresponds to, or the value of which actually is, a maximum pressure applied to a MEMS pressure transducer.

In FIG. 5, the minimum output signal value V1 is generated from each pressure sensor when a first minimum pressure, P1, is applied to the MEMS pressure transducers; the maximum signal output value, V2, however, is generated by each pressure sensor responsive to different applied pressures, P2 and P3. The slope or scale of the first graph 502 is thus greater than the slope or scale of the second graph 504.

Figure 7:
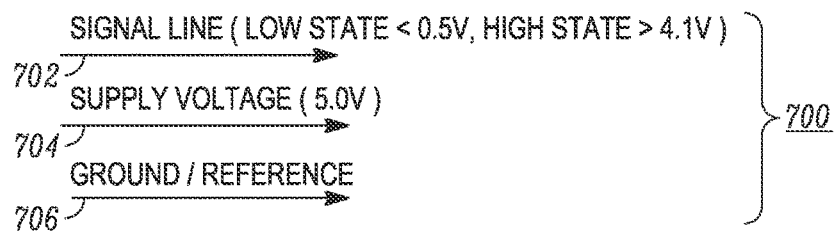
FIG. 7 depicts the transmission of data over a three-wire Single Edge Nibble Transmission (SENT) bus.
Figure 8:
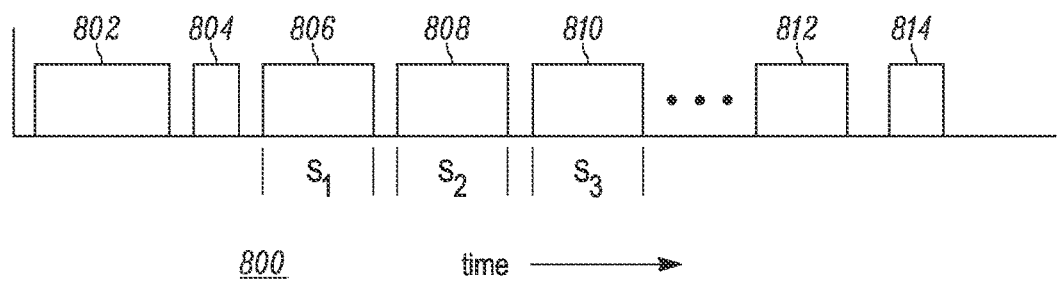
FIG. 8 depicts how multiple pressure measurements are sent sequentially over a serial data bus.

In the case of the first graph 502, the maximum output signal value, V2, is produced from the sensor when the pressure applied to the sensor is at P2, which is significantly less than the pressure, P3, which must be applied to the other sensor in order to cause its output signal to reach V2. In the case of the first graph 502, the maximum signal output value, V2, is produced at a lesser or reduced applied pressure value than that whis required by the second sensor, the output of which is represented by the second graph 504. The first graph 502 thus shows the output from a first processor for a first sensor comprising a first MEMS pressure transducer, responsive to pressures that vary between a first minimum value, P1, and a second maximum value P2. The second graph 504 shows the output of a second processor for a second sensor comprising a second MEMS pressure transducer, responsive to pressures that vary between P1 and a third pressure P3, which is greater than P2. The signals from the first pressure sensor, which are shown in the first graph 502, have a greater precision or accuracy between P1 and P2 than does the signal from the second pressure sensor between the same pressures, P1 and P2. Stated another way, the first processor provides a first substantially linearly varying output signal having a first slope, which corresponds to a first scaling factor while the second processor generates a second signal having a lesser slope due to the fact that it uses a second scaling factor less than the first scaling factor. A dual-range or multi-range, high-precision pressure sensor that can be attached to a pressurized fluid at a single point of connection can thus be realized by enclosing two or more MEMS pressure transducers, each of which is coupled to the pressurized fluid, the electrical output signals of which are processed by the same type of, but differently programmed, processors. As described below, and as shown in FIGS. 7 and 8, the outputs from the separate processors are formatted into a serial data stream, which is output to a serial data bus by which the various pressure measurements can be read according to their location in the serial data stream.

Those of ordinary skill in the art will recognize that the twelve-bit output of an A/D converter can theoretically represent up to four thousand ninety six (4096) different input values. The granularity or resolution of a 12-bit digital representation of a pressure measurement that is taken over a first range of pressures that is narrower than a second range of pressures will thus be greater than the resolution of a 12-bit, digital representation of a measurement taken over the second, greater range of pressures.

Figure 6A:
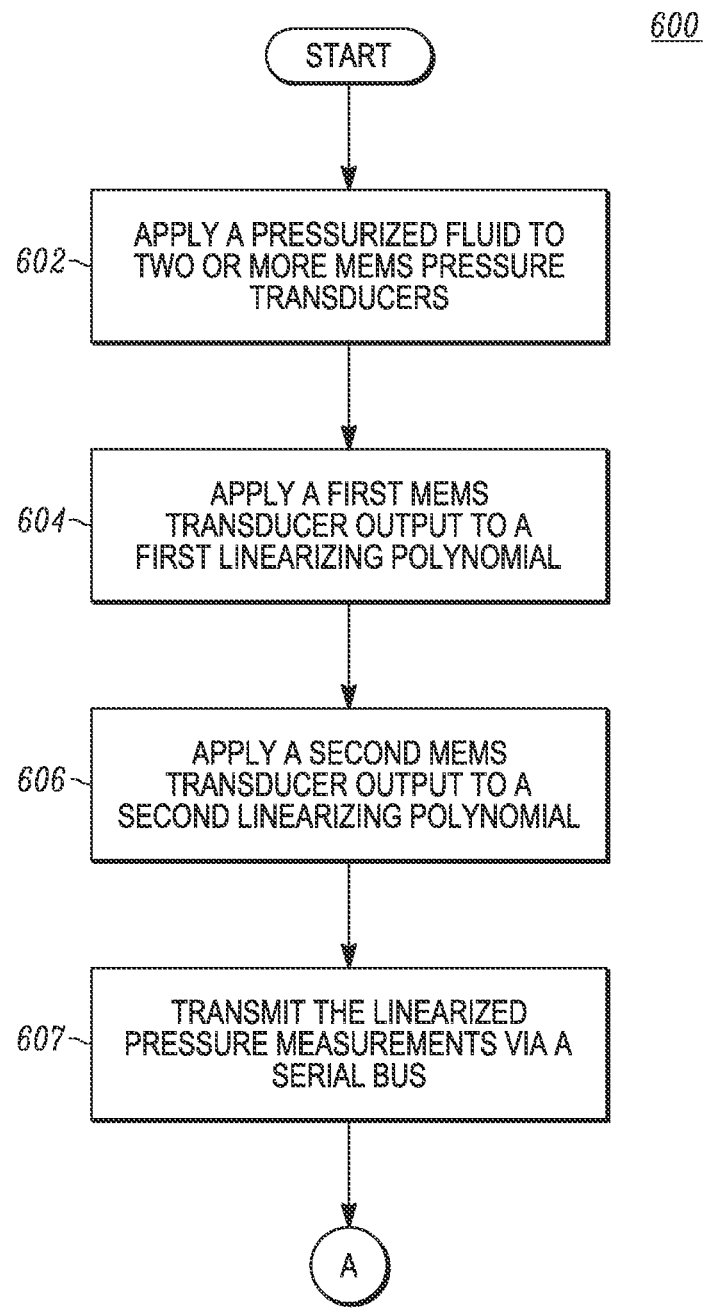
FIGS. 6A and 6B depict a flowchart depicting steps of a method by which a high-precision dual range signal, representative of a fluid pressure is generated using two MEMS pressure transducers and two corresponding processors that receive and linearize the outputs of the pressure transducers.
Figure 6B:
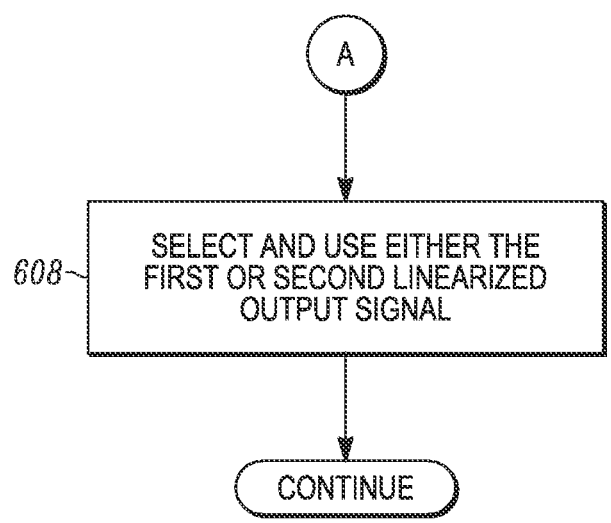

FIGS. 6A and 6B depict a flowchart showing steps of a method 600 by which a dual range or multi-range signal representative of a fluid pressure is produced using two or more different MEMS pressure transducers and two processors, the processors being programmed or configured to operate on the MEMS pressure transducer outputs using a polynomial, the coefficients of which correct nonlinearities in the MEMS pressure transducer output and produce a substantially linearly varying output signal.

In a first step 602, a pressurized fluid is applied to at least two MEMS pressure transducers. As described above, each transducer is configured to generate an output signal responsive to the pressure of fluid applied to the transducer. The output signal, however, is usually non-linear and, in an embodiment, the output signal is a DC voltage.

In second and third steps, 604, 606, which may be performed contemporaneously, a first substantially linearly-varying output signal from a first processor, representative of a pressure applied to a first MEMS pressure transducer is generated by the first processor operating on the output signal from the first MEMS pressure transducer using a first polynomial having a first set of coefficients. The coefficients of the first polynomial operate on the output of the first pressure transducer and produce a substantially linearly varying output in the form of a digital word, the magnitude of which corresponds to the magnitude of the applied pressure.

In a second step, which may be executed contemporaneously with the first step, a second applied pressure output signal is generated by receiving the output of the second MEMS pressure transducer and operating on that signal by the same polynomial but which has different coefficients. The different coefficients of the two polynomials, each of which is determined either heuristically or empirically, provide output signals that range between the same or essentially the same minimum and maximum values albeit responsive to different input pressures.

At step 607, the two, linearized pressure measurements provided by the two processors are transmitted onto a serial data bus, as described below. At step 608, one or both transmitted pressure measurements are selected for a subsequent use.

Those of ordinary skill in the art will recognize that a third, fourth, or fifth MEMS pressure transducer could be added to the planar surface 110 of the fluid port 104 and then be coupled to a third, fourth, or fifth processor. The third, fourth, or fifth processor could be fabricated within the same silicon die 132 or a different silicon die. A high-precision pressure sensor having multiple different measurement ranges can then be realized. In a preferred embodiment, multiple pressure measurements from a single pressure sensor are transmitted over a serial bus, one after another, using the "SENT" protocol described below.

The Society of Automotive Engineers (SAE) J2716 Single Edge Nibble Transmission (SENT) protocol is a protocol used for transmitting signal values from a sensor to a controller. According to the standard, and as shown in FIG. 7, a SENT bus 700 comprises three conductors or wires: a signal line 702, a supply voltage 704, and a ground line 706. Messages are sent one-way and sent asynchronously.

A SENT message typically comprises: a calibration/sync pulse; a 4-bit status, and serial communication nibble of 12 to 27 clock pulses; a sequence of from one to six, 4-bit nibble pulses representing values of signals being sent; and a 4-bit checksum.

FIG. 8 depicts the sequential transmission 800 of fluid pressure measurements 806, 808, 810 from the DSP 420 or other processor sequentially over time via a three-wire, Single Edge Nibble Transmission (SENT) bus 700, as shown in FIG. 7. Each pressure measurement 806, 808, 810 transmitted onto the bus 700 is a measurement of the same fluid by multiple different pressure transducers coupled to the same pressurized fluid, but represent pressure measurements taken over different pressure ranges by selecting different coefficients for the linearizing polynomial.

In FIG. 8, a synchronization/calibration pulse 802, the length of which can be up to fifty-six clock pulses, is followed by a four-bit status and serial communication nibble 804. Three separate data "fields" 806, 808, 810 are sent sequentially or serially, one after another, followed by a cyclic redundancy check (CRC) 812 consisting of 4 bits. An optional pause 814 follows the CRC 812.

Each field 806, 808, 810 is assigned or designated to carry pressure measurement data of a corresponding pressure transducer. By way of example, the pressure data from a first pressure transducer can thus be sent using the first field 806, which occupies a corresponding first time slot S1 in the message 800, with the data from second and third transducers being sent in the second and third fields 808, 810 respectively, and which occupy corresponding second and third time slots, S2, S3 in the same message 800. Dual range or multi-range pressure measurements can thus be sent continuously over the same set of conductors, one after the other, with the different-range measurements being selectable as needed simply by reading appropriate data fields at different relative times, S1, S2, S3 in a single message 800. By way of example, data representing fluid pressure, which is obtained from a first processor configured to provide data representing pressures between about 1 bar and 100 bar, (1 bar≈1 atmosphere) can be sent in a first field 806 during a first time slot S1. Data representing fluid pressure, which is obtained from a second processor configured to provide data representing pressures between about 1 bar and 50 bar, can be sent in the second field 808 during a second time slot S2. Data representing fluid pressure, which is obtained from a third processor configured to provide data representing pressures between some other pressures, can be sent in the third field 810 during a third time slot S3. Multiple measurements of the pressure on a fluid can thus be conducted simultaneously by different pressure transducers coupled to corresponding processors and selectively read according to their location in a serial data stream.

By appropriately selecting coefficients of linearizing polynomials, a nonlinear output of a MEMS pressure transducer is converted to a linear, digital-format signal, a minimum value of which is generated when the applied pressure to the MEMS pressure transducer is at a predetermined minimum level; the maximum value of the output is generated when the pressure applied to the MEMS pressure transducer is at a predetermined maximum level. By selecting different coefficients, however, the minimum and maximum output signals are generated at different input pressure ranges. A high-precision dual-range or even multi-range pressure sensor is thus realized by locating multiple, MEMS pressure transducers into the same housing and providing each MEMS pressure transducer with its own, output signal-correcting processor.

The foregoing description is for purposes of illustration only. The true scope of the invention is set forth in the following claims.

The invention claimed is:

1. A pressure sensor comprising:
   a housing comprising a fluid port, configured to receive a pressurized fluid;
   a plurality of micro-electromechanical system (MEMS) pressure transducers mounted inside the housing and coupled to the fluid port, each MEMS pressure transducer configured to generate a MEMS pressure transducer output signal responsive to a pressure applied to a MEMS pressure transducer through the fluid port;
   a single silicon die comprising a plurality of processors, each processor being coupled to a corresponding MEMS pressure transducer and receiving the MEMS pressure transducer output signal there from, each processor configured to generate an applied pressure output signal, which is representative of a pressure applied to the MEMS pressure transducer that is coupled to its corresponding processor, the applied pressure output signal having a value, which is determined by its corresponding processor evaluating a polynomial having a plurality of coefficients, the coefficients of the polynomial operating on a value, the value being representative of its corresponding MEMS pressure transducer output signal;
   wherein the MEMS pressure transducer output signal is non-linear and wherein each of the processors generates an applied pressure output signal that varies substantially linearly between a first minimum value output and a second maximum value output responsive to variations in the pressure applied to a MEMS pressure transducer ranging between a first minimum pressure and second maximum pressure;
   wherein a first processor of the plurality of processors on the silicon die generates the first minimum value output signal responsive to application of the first minimum pressure and generates the second maximum output signal value responsive to application of the second maximum pressure; and
   wherein a second processor of the plurality of processors on the silicon die generates the first minimum value output signal responsive to the first minimum pressure and generates the second maximum output signal responsive to application of a third pressure, which is less than the second maximum pressure.

2. The pressure sensor of claim 1, wherein the first processor provides a first, applied pressure output signal generated using a first polynomial and wherein the second processor provides a second, applied pressure output signal using a second polynomial.

3. The pressure sensor of claim 2, wherein the applied pressure output signal is a binary number.

4. The pressure sensor of claim 2, wherein the MEMS pressure transducer output signal is a voltage.

5. The pressure sensor of claim 2, wherein the second processor generates the first minimum value output signal responsive to a third pressure, which is greater than the first minimum pressure and generates the second maximum output signal responsive to application of the second maximum pressure.

6. The pressure sensor of claim 2, wherein a third processor generates the first minimum value output signal responsive to a third pressure, which is greater than the first minimum pressure and generates the second maximum output signal responsive to application of the fourth maximum pressure, which is less than the second maximum pressure.

7. The pressure sensor of claim 2, further comprising an annular circuit board having a central opening and being located and fixed within a cylinder, wherein the silicon die is attached to the annular circuit board, wherein the MEMS pressure transducers are located within the central opening.

8. The pressure sensor of claim 2, wherein a smallest difference between two unequal pressure-measurement values of the first, applied pressure output signal differs from a smallest difference between two unequal pressure-measurement values of the second, applied pressure output signal.

9. The pressure sensor of claim 2, wherein the processors are configured to transmit pressure data onto a serial data bus.

10. The pressure sensor of claim 2, wherein polynomial coefficients in the second processor are different from the polynomial coefficients in the first processor.

11. A method of providing a dual range signal, which is representative of a fluid pressure, the method comprising:
    applying a pressurized fluid to first and second micro-electromechanical system (MEMS) pressure transducers, each MEMS pressure transducer configured to generate a respective MEMS pressure transducer output signal responsive to the pressure of the fluid applied to the respective MEMS pressure transducer;
    generating a first applied pressure output signal, representative of the pressure applied to the first MEMS pressure transducer by evaluating a first polynomial having a first plurality of coefficients, the coefficients of the first polynomial operating on a value, which is representative of the MEMS pressure transducer output signal output from the first MEMS pressure transducer such that the first applied pressure output signal is a first minimum value output signal responsive to the pressurized fluid being at a first minimum pressure and such that the first applied pressure output signal is a second maximum output signal value responsive to the pressurized fluid being at a second maximum pressure; and generating a second applied pressure output signal, representative of the pressure applied to the second MEMS pressure transducer by evaluating a second polynomial having a second plurality of coefficients, the coefficients of the second polynomial, at least one of the second plurality of coefficients being different than the first plurality of coefficients, the second plurality of coefficients operating on a value, which is representative of the MEMS pressure transducer output signal output from the second MEMS pressure transducer such that the second applied pressure output signal is the first minimum value output signal responsive to the pressurized fluid being at the first minimum pressure and such that the second applied pressure output signal is the second maximum output signal responsive to the pressurized fluid being at a third pressure, which is less than the second maximum pressure.

12. The method of claim 11, wherein the MEMS pressure transducer output signals are non-linear and wherein both first and second applied pressure output signals vary substantially linearly between a first minimum value and a second maximum value, the substantially linearly varying applied pressure output signals being determined from non-linearly varying MEMS pressure transducer signals responsive to selection of the first plurality of coefficients and the selection of the second plurality of coefficients.

13. The method of claim 11, wherein the steps of generating first and second applied pressure output signals comprise evaluating the first and second polynomials using separate, first and second polynomial-evaluating processors, which are co-located on the same silicon die.

* * * * *